(12) United States Patent
Vo

(10) Patent No.: US 6,333,887 B1
(45) Date of Patent: Dec. 25, 2001

(54) CIRCUITS AND METHODS FOR SELECTIVELY COUPLING REDUNDANT ELEMENTS INTO AN INTEGRATED CIRCUIT

(75) Inventor: Huy Thanh Vo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/596,966

(22) Filed: Jun. 20, 2000

Related U.S. Application Data

(63) Continuation of application No. 09/031,868, filed on Feb. 27, 1998, now Pat. No. 6,077,211.

(51) Int. Cl.⁷ .................................................. G11C 8/00
(52) U.S. Cl. ........................................ 365/225.7; 365/200
(58) Field of Search ................................ 365/225.7, 200

(56) References Cited

U.S. PATENT DOCUMENTS

| 5,281,868 | * | 1/1994 | Morgan ............................. 307/441 |
|---|---|---|---|
| 5,574,689 | * | 11/1996 | Morgan ............................. 365/200 |
| 5,583,463 | * | 12/1996 | Merritt .............................. 327/526 |
| 5,627,786 | * | 5/1997 | Roohparvar ....................... 365/200 |
| 5,706,292 | * | 1/1998 | Merritt ............................. 371/10.2 |
| 5,812,466 | * | 9/1998 | Lee et al. .......................... 365/200 |
| 6,077,211 | * | 6/2000 | Vo ..................................... 365/200 |

* cited by examiner

*Primary Examiner*—David Nelms
*Assistant Examiner*—M. Tran
(74) *Attorney, Agent, or Firm*—Scgwegman, Lundberg, Woessner & Kluth, P.A.

(57) ABSTRACT

A circuit and method for selectively coupling redundant components into an integrated circuit. Global I/O lines are coupled to local I/O lines through a number of multiplexors. Bitlines are grouped into blocks of bitlines. A fuse bank couples to the number of multiplexors through a logic/select circuit. When at least one fuse's state indicates that the associated I/O line is inoperable, the logic/select circuit switches the coupling to connect the global I/O line with a redundant local I/O line. The redundant local I/O's are configured to access the original block of bitlines. The arrangement conserves precious chip space and preserves uniform timing between normal and redundant data.

28 Claims, 8 Drawing Sheets

US 6,333,887 B1

CIRCUITS AND METHODS FOR SELECTIVELY COUPLING REDUNDANT ELEMENTS INTO AN INTEGRATED CIRCUIT

This application is a Continuation of U.S. Ser. No. 09/031,868, filed Feb. 27, 1998 is now U.S. Pat. No. 6,077,211.

FIELD OF THE INVENTION

The present invention relates generally to semiconductor integrated circuits. More particularly, it pertains to circuits and methods for selectively coupling redundant elements into an integrated circuit.

BACKGROUND OF THE INVENTION

An integrated circuit is a complete electronic circuit, containing transistors, diodes, resistors, and capacitors, along with their interconnecting electrical conductors, e.g., input/output (I/O) lines, contained entirely within a single chip of silicon. Integrated circuits continue to decrease in size, and the circuits they contain continue to increase in complexity. This increases the chances of defective chips resulting from a failed element or a defective conductor.

One way to reduce semiconductor scrap is to provide redundant elements on the integrated circuits. That way, if a primary element is defective a redundant element can be substituted in its place. One area which can benefit from the use of redundancy is with I/O lines of, for example, a memory circuit. Typical memory circuits comprise millions of equivalent memory cells arranged in addressable rows and columns. Modern memory blocks can include as many as 128 or more pair of I/O lines accessing a four (4) mega-bit block of memory. If one or more of these pairs of I/O lines is inoperable, then usable memory space becomes un-accessible.

Early techniques to ameliorate this situation included global re-routing to another location on or off the memory circuit chip. Global re-routing is achieved by using a replacement pair of I/O lines to address a replacement portion of memory. Replacing the defective I/O pair typically comprises opening fuse-type circuits to 'program' a redundant I/O pair to respond. However, the replacement I/O and the replacement portion of memory require chip space. The cost of the chip space required by global re-routing was acceptable when I/O lines addressed a smaller number of columns. Now, however, providing additional memory blocks at other locations on or off the chip is very costly. Additionally, the timing between addressing sequences must be adjusted for the re-routing delay. This slows the operation of the memory. Thus, the global re-routing scheme requires circuitry which adversely effects the available real estate and slows the operation of the memory.

For the reasons stated above, and for other reasons stated below which will become apparent to those skilled in the art upon reading and understanding the present specification, there is a need in the art for circuits and methods to replace inoperative I/O lines without consuming valuable chip space or creating an operating time penalty.

SUMMARY OF THE INVENTION

The above mentioned problems with redundancy repair schemes and other problems are addressed by the present invention and will be understood by reading and studying the following specification. A repair scheme is described which selectively couples redundant elements into an integrated circuit.

In particular, an illustrative embodiment of the present invention includes an input/output repair circuit. The input/output repair circuit includes a fuse bank. The fuse bank has multiple fuses which are programmed in either a first or a second state. A logic/select circuit couples to the fuse bank. A number of multiplexors couple to the fuse bank through the logic/select circuit. A number of first input/output lines couple to the number of multiplexors. There are a number of second input/output lines. Each of the number of second input/output lines selectively couple to the number of multiplexors. The number of second input/output lines is greater than the number of first input/output lines. Thus, the number of second input/output lines include at least one redundant line that can be selectively coupled to the first input/output lines through the multiplexers when necessary to "repair out" or "replace" a defective input/output line. The multiplexers effectively isolate the defective input/output line by not coupling the defective line to one of the first input/output lines. Further, the multiplexers shift the connections for a portion of the first input/output lines to adjacent second input/output lines for each the second input/output lines between the defective second input/output line and the redundant input/output line.

In another embodiment, a memory circuit is provided. The memory circuit includes multiple rows of wordlines within a memory block. The memory circuit has multiple columns of bitlines also within the memory block. The intersection of the multiple rows of wordlines and multiple columns of bitlines have memory cells.

A number of sense amplifiers couple to the multiple columns of bitlines. A column decoder couples to the number of sense amplifiers. A number of local input/output lines couple to the multiple columns of bitlines through the column decoder. There are a number of global input/output lines. A number of multiplexors couple the number of local input/output lines to the number of global input/output lines. There is a fuse bank which has a number of fuses. Each fuse within the fuse bank is programmed to a first state or a second state. A logic/select circuit couples the fuse bank to the number of multiplexors such that the state of the fuse determines the coupling between the number of local input/output lines to the number of global input/output lines.

In another embodiment, a method for replacing inoperable input/output lines in a memory circuit is provided. The method includes reading a number of fuses in a fuse bank. Each fuse is programmed to a first or a second state. The fuses are associated with a number of multiplexors. The state of the fuse is passed from the number fuses through a logic/select circuit and to the number of multiplexors. At least one of the number of multiplexors is caused to switch the coupling between a global input/output line and a number of local input/output lines when the fuse associated with the multiplexor is programmed to the second state.

In another embodiment, a method for replacing inoperable input/output lines in a memory circuit is provided. The method includes reading the state of a number of programmed fuses. The number of programmed fuses are associated with a number of multiplexors. Each of the number of multiplexors couples a global input/output line to a number of local input/output lines. When at least one of the fuses is programmed to indicate that one of the number of local input/output lines coupled to one of the number of multiplexors is inoperable, that input/output line is replaced with an adjacent local input/output line.

In another embodiment, an information handling system is provided. The information handling system includes a central processing unit. A random access memory is also provided. The random access memory includes multiple rows of wordlines within a memory block. The random access memory has multiple columns of bitlines also within the memory block. The intersection of the multiple rows of wordlines and multiple columns of bitlines have memory cells. A number of sense amplifiers couple to the multiple columns of bitlines. A column decoder couples to the number of sense amplifiers. A number of local input/output lines couple to the multiple columns of bitlines through the column decoder. There are a number of global input/output lines. A number of multiplexors couple the number of local input/output lines to the number of global input/output lines. There is a fuse bank which has a number of fuses. Each fuse within the fuse bank is programmed to a first state or a second state. A logic/select circuit couples the fuse bank to the number of multiplexors such that the state of the fuse determines the coupling between the number of local input/output lines to the number of global input/output lines. A system bus communicatively couples the central processing unit and the random access memory.

Thus, an improved redundant input/outline repair scheme is provided. The repair scheme selectively couples redundant elements into an integrated circuit. The repair scheme allows for a reduction in the number of redundant elements required, thus conserving precious chip surface space. The repair scheme additionally avoids any operating time delay as can arise from locating and traversing redundant elements.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE EMBODIMENTS

Figure 1:
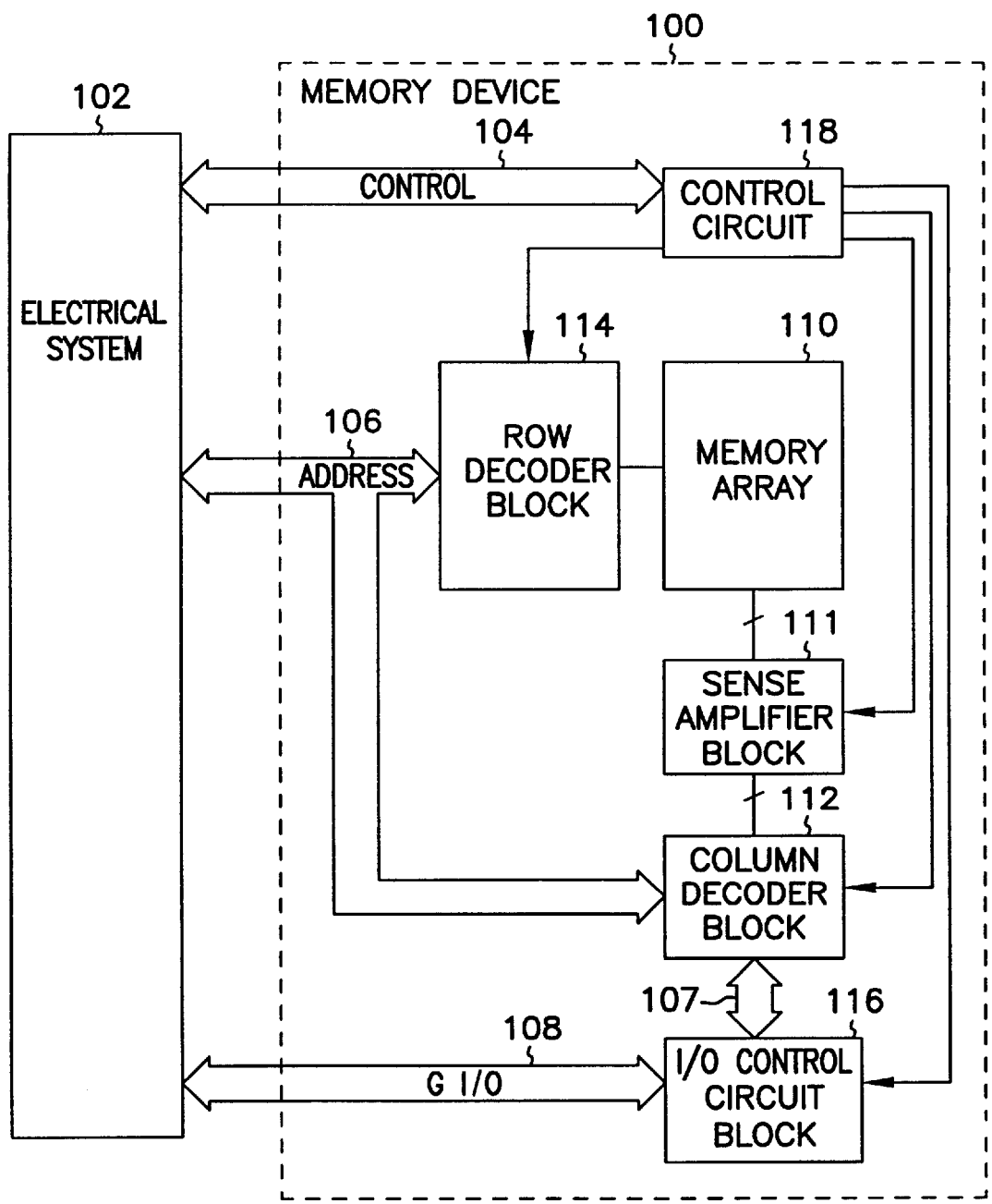
FIG. 1 is a block diagram illustrating an electronic circuit which includes an input/output repair circuit according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

FIG. 1 is a block diagram illustrating an electronic circuit which includes an input/output repair circuit according to the teachings of the present invention. FIG. 1 includes a memory array 110. The memory array 110 is coupled to a sense amplifier block 111. The sense amplifier block 111 is coupled to a column decoder block 112. The memory array 110 is coupled to a row decoder block 114. The column decoder block 112 is additionally coupled to an input/output (I/O) control circuit block 116.

FIG. 1 further includes an electronic system 102. The electronic system 102 couples through a control bus 104 to a control circuit 118. The control circuit 118 couples to the row decoder block 114, the sense amplifier block 111, the column decoder block 112 and the input/output control circuit block 116. The input/output control circuit block 116 additionally includes a grouping of a number of first input/output (GI/O) lines 108 which couple to the electronic system 102. In one embodiment, the first input/output lines 108 are global input/output lines. The input/output control circuit block 116 includes a grouping of a number of second input/output lines 107 which couple to the column decoder block 112. In one embodiment, the second input/output lines 107 are local input/output lines. The number of second input/output lines 107 is greater than the number of first input/output lines 108. The electronic system 102 further includes an address bus 106 that couples to the row decoder block 114 and the column decoder block 112.

The control circuit 118, the row decoder block 114, the memory array 110, the sense amplifier block 111, the column decoder block 112 and the input/output control circuit block 116 all form a part of memory device 100.

Figure 2:
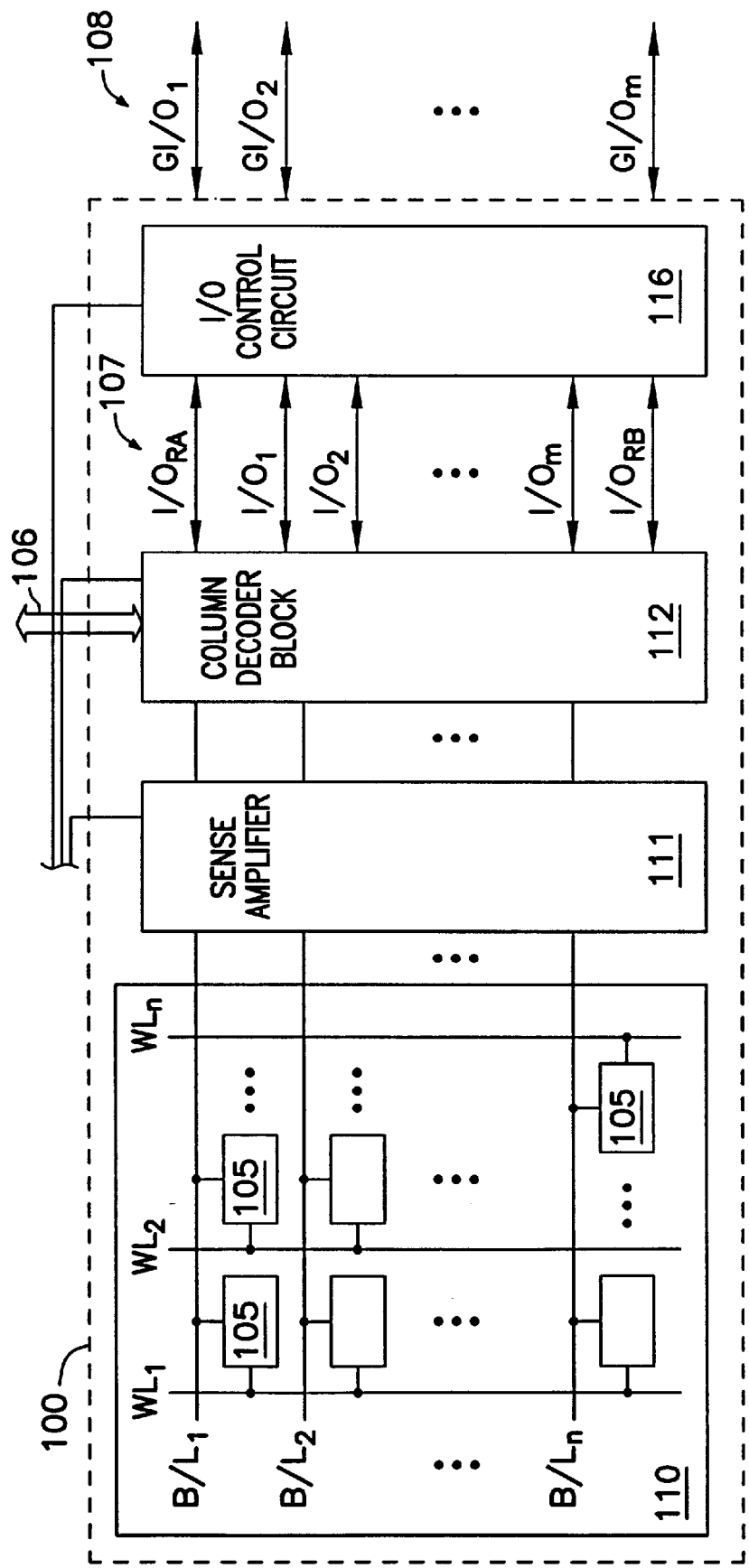
FIG. 2 is a block diagram illustrating in more detail the memory array, the sense amplifier block, the column decoders, and the input/output (I/O) control circuit of the electronic circuit of FIG. 1.

FIG. 2 is a block diagram illustrating in more detail an embodiment of memory array 110, sense amplifier block 111, column decoder block 112, and input/output control circuit 116 for use in the memory device of FIG. 1. Memory array 110 includes multiple rows of wordlines, $WL_1$, $WL_2$, . . . $WL_n$, and multiple columns of bitlines, $BL_1$, $BL_2$, . . . , $BL_n$. The intersections of the multiple rows of wordlines, $WL_1$, $WL_2$, . . . , $WL_n$, and multiple columns of bitlines, $BL_1$, $BL_2$, . . . , $BL_n$, form multiple memory cells 105. The sense amplifier block 111 comprises a number of sense amplifiers which couple to the multiple columns of bitlines $BL_1$, $BL_2$, . . . , $BL_n$. The column decoder block 112 couples a number of the second input/output lines or local I/O lines, $I/O_{RA}$, $I/O_1$, $I/O_2$, $I/O_m$, $I/O_{RB}$, collectively 107, to the multiple columns of bitlines $BL_1$, $BL_2$, . . . , $BL_n$ through the number of sense amplifiers. An address bus 106 couples to the column decoder block 112. The number of local I/O lines 107 couple to the input/output control circuit block 116.

A number of first input/output lines or global I/O lines, $GI/O_1$, $GI/O_2$, . . . , $GI/O_m$, collectively 108, also couple to the input/output control circuit block 116. The column decoder 112 receives bitline addresses over the address bus 106. Based on the address instruction, the column decoder 112 couples the appropriate second I/O line, through a sense amplifier, to the selected bitline. Depending on the scaling of a given system, there may be eight (8) or more bitlines for each individual second input/output line.

The global I/O lines 108 are responsible for shuttling bits of data on and off of a given memory chip to other parts of an electronic circuit. The input/output control circuit 116 controls the coupling between the local I/O lines 107 and the global I/O lines 108. In this manner, the bits of data are shuttled between the global I/O lines 108 and the local I/O lines 107. In one embodiment, the number of global I/O lines 108 coupled to the input/output control circuit 116 is N I/O lines and the number of local I/O lines coupled to the input/output control circuit 116 is N+1 I/O lines. In another embodiment, the number of global I/O lines 108 coupled to the input/output control circuit 116 is N I/O lines and the number of local I/O lines coupled to the input/output control circuit 116 is N+2 I/O lines. However, in other applications the number of local I/O lines 107 can be varied to meet the requirements of the application.

Figure 3:
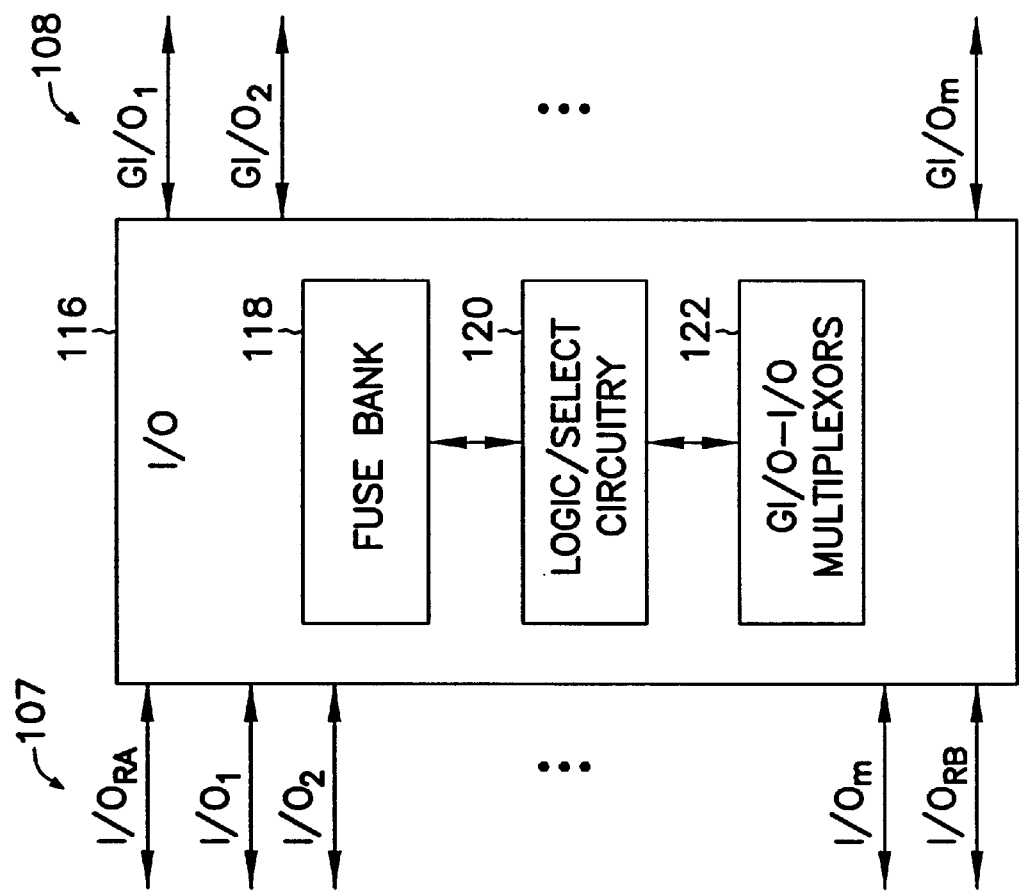
FIG. 3 is a block diagram illustrating in more detail the (I/O) control circuit portion of the electronic circuit of FIG. 1.

FIG. 3 is a block diagram illustrating in more detail an embodiment of an input/output control circuit for use in memory device 100 of FIG. 1. In FIG. 3, the input/output control circuit block 116 includes a fuse bank 118, a logic/select circuit 120, and a number of multiplexors, collectively 122. The fuse bank 118 is coupled to the number of multiplexors 122 through the logic/select circuit 120. The number of first input/output or global I/O lines, $GI/O_1$, $GI/O_2$, ..., $GI/O_m$, collectively 108, also couple to the input/output control circuit block 116 and specifically to the number of multiplexors 122. Likewise, the number of second input/output lines or local I/O lines, $I/O_{RA}$, $I/O_1$, $I/O_2$, $I/O_m$, $I/O_{RB}$, collectively 107, couple to the input/output control circuit block 116 and specifically to the number of multiplexors 122.

Each one of the global I/O lines 108 is paired through one of the number of multiplexors 122 to one of the number of local I/O lines 107. Generally, each memory chip is tested on the fabrication line for defective circuitry. When a defective local I/O line is detected it must be removed from the active circuit and replaced by a redundant, operable local I/O line. This process is accomplished using fuse circuits. The fuse bank 118 contains a number of fuses. The number of fuses in the fuse bank 118 are associated with the number of multiplexors 122 which couple the number of global I/O lines 108 to the number of local I/O lines 107. When one of the number of global I/O lines is paired to a defective one of the number of local I/O lines, the fuses in the fuse bank 118 are programmed to disable the defective local I/O line and couple the global I/O line to a different, operable I/O line, e.g., an adjacent local I/O line. Thus, the fuse is programmed from a first state to a second state. In operation, when the memory block 100 is addressed, the fuse bank 118, through a logic/select circuitry 120, controls the number of multiplexors 122. The number of multiplexors 122 are formed of standard circuitry well known in the industry. Based on the state of fuses in fuse bank 118, the number of multiplexors 122 causes global I/O lines 108 to be coupled to operable local I/O lines 107, including one or more redundant I/O lines if the initial pairing of global and local I/O lines included a defective local I/O line. FIG. 3 illustrates the redundant I/O lines at the ends of the set of local I/O lines as lines $I/O_{RA}$ and $I/O_{RB}$. In other embodiments, another number of redundant I/O lines can be used with the redundant I/O lines selectively placed among the number of local I/O lines.

Figure 4:
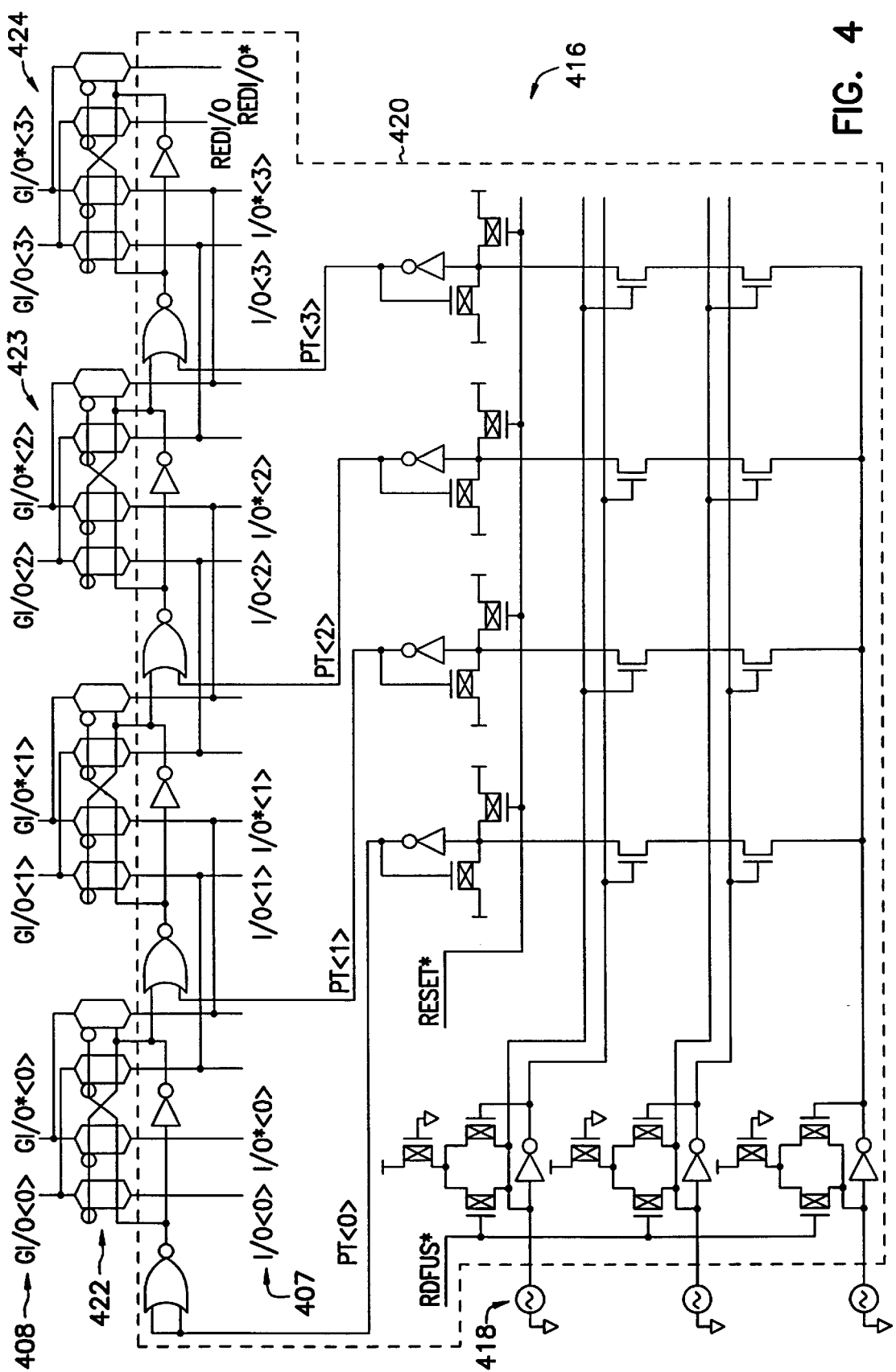
FIG. 4 is a schematic diagram illustrating in more detail an embodiment of the I/O control circuit of FIG. 3.

FIG. 4 is a schematic diagram illustrating in more detail an embodiment of an I/O control circuit, indicated generally at 416. In FIG. 4, the I/O control circuit 416 includes a fuse bank 418, a logic/select circuit 420, and a number of multiplexors 422. The fuse bank 418 is coupled to the number of multiplexors 422 through the logic/select circuit 420. In this embodiment, the number of first input/output or local I/O lines 408 includes complementary pairs of I/O lines identified as GI/O<0>, GI/O*<0>, ... GI/O<3>, GI/O*<3> that are also coupled to the I/O control circuit 416 and specifically to the number of multiplexors 422. Likewise, in this embodiment, the number of second input/output lines or local I/O lines 107, similarly includes complementary pairs of I/O lines identified as I/O<0>, I/O*<0>, ... I/O<3>, I/O*<3>, REDI/O, REDI/O* that are couple to the I/O control circuit 416 and specifically to the number of multiplexors 422.

In this embodiment, each fuse in the fuse bank 418 is indirectly associated with one of the number of multiplexors 422 through a decoder portion of the logic/select circuit 420. The fuse bank 418 is additionally located on a portion of the chip which provides for easy and more direct access, e.g., away from the I/O multiplexor circuitry and metallization layers. This embodiment allows for a fewer number of fuses in the fuse bank 418 to control the operation of a larger number of multiplexors 422. Also, as mentioned above, each fuse in the fuse bank 418 is more readily accessible without disruption to the metallization layers of the memory chip. This embodiment provides for one redundant local I/O line pair per memory block. Each one of the number of multiplexors 422 couples one pair of the number of global I/O lines 408 to one of two pair of the number of local I/O lines 407.

In operation, I/O control circuit 416 selectively connects local I/O lines 407 with global I/O lines 408. When the memory circuit is fabricated, it is tested to determine whether any of the local I/O lines 407 are defective. Based on this test, fuses or antifuses in fuse bank 418 are selectively blown to indicate which local I/O lines 407 should be connected to each of the global I/O lines 408. Logic/select circuit 420 reads the state of the fuses in fuse bank 418 on power-up using signals RDFUS* and RESET* and feeds this information to the selector inputs of the multiplexers 422. Thus, for example, if none of the local I/O lines 407 are defective, then each multiplexer 422 simply connects each global I/O line 408 with a similarly labeled local I/O line 407.

However, if one of the local I/O lines 407 is determined to be defective, then the logic/select circuit 420 provides signals to the multiplexers 422 such that the defective local I/O line 407 is not connected to a global I/O line 408. Instead, the redundant local I/O line pair, REDI/O and REDI/O*, is coupled to a pair of the global I/O lines 408. For example, if the pair of local I/O lines 407 that are labeled I/O<2> and I/O*<2> are determined to be defective, then fuses are blown such that logic/select circuit 420 generates a control signal for multiplexer 423 to couple global I/O lines GI/O<2> and GI/O*<2> to local I/O lines I/O<3> and I/O*<3> instead of local I/O lines I/O<2> and I/O*<2>. Further, logic/select circuit 420 also generates a control signal such that multiplexer 424 couples global I/O lines GI/O<3> and GI/O*<3> to local I/O lines REDI/O and REDI/O* instead of local I/O lines I/O<3> and I/O*<3> and I/O* <3>.

Figure 5:
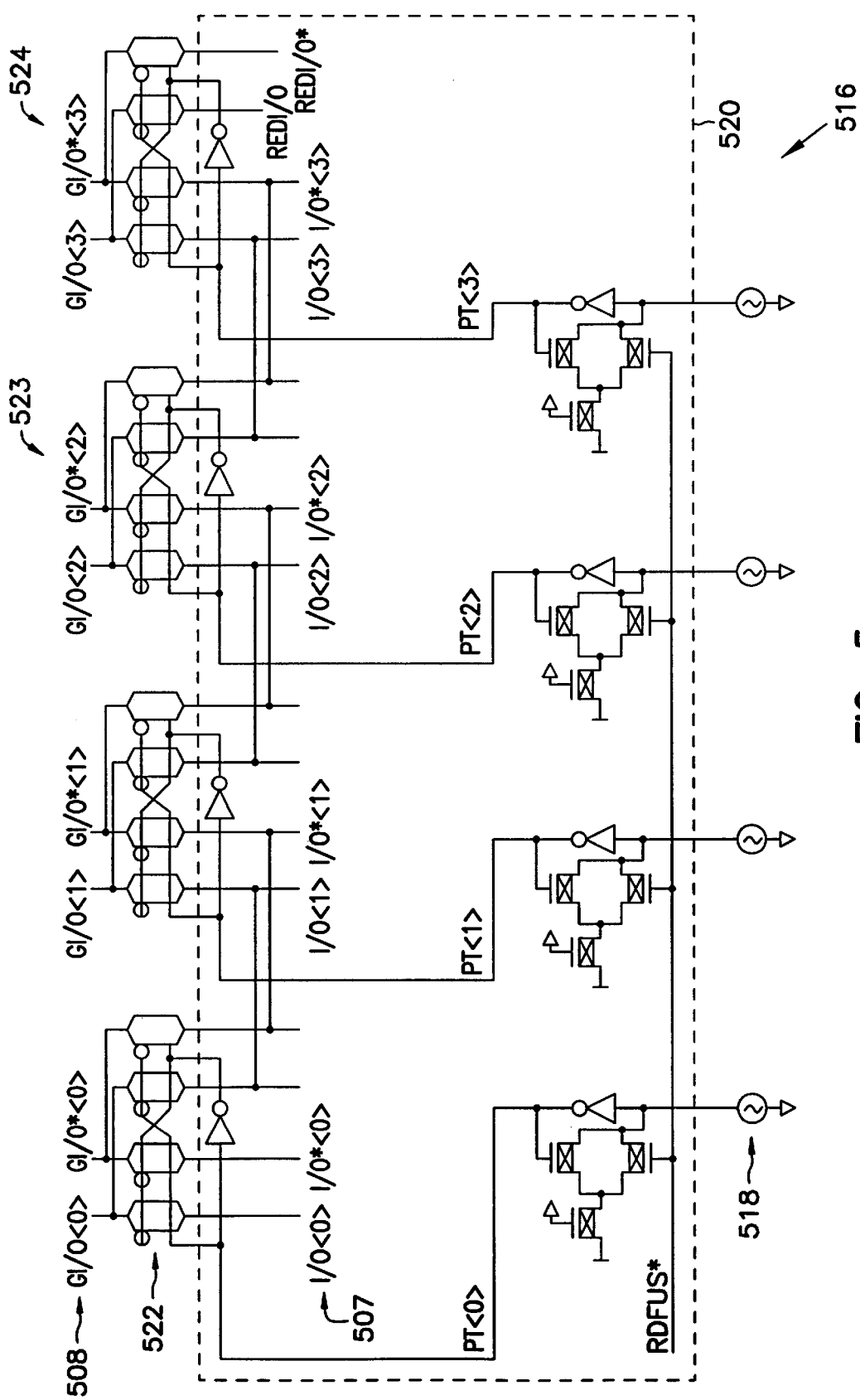
FIG. 5 is a schematic diagram illustrating in more detail an alternate embodiment of the I/O control circuit of FIG. 3.
Figure 6A:
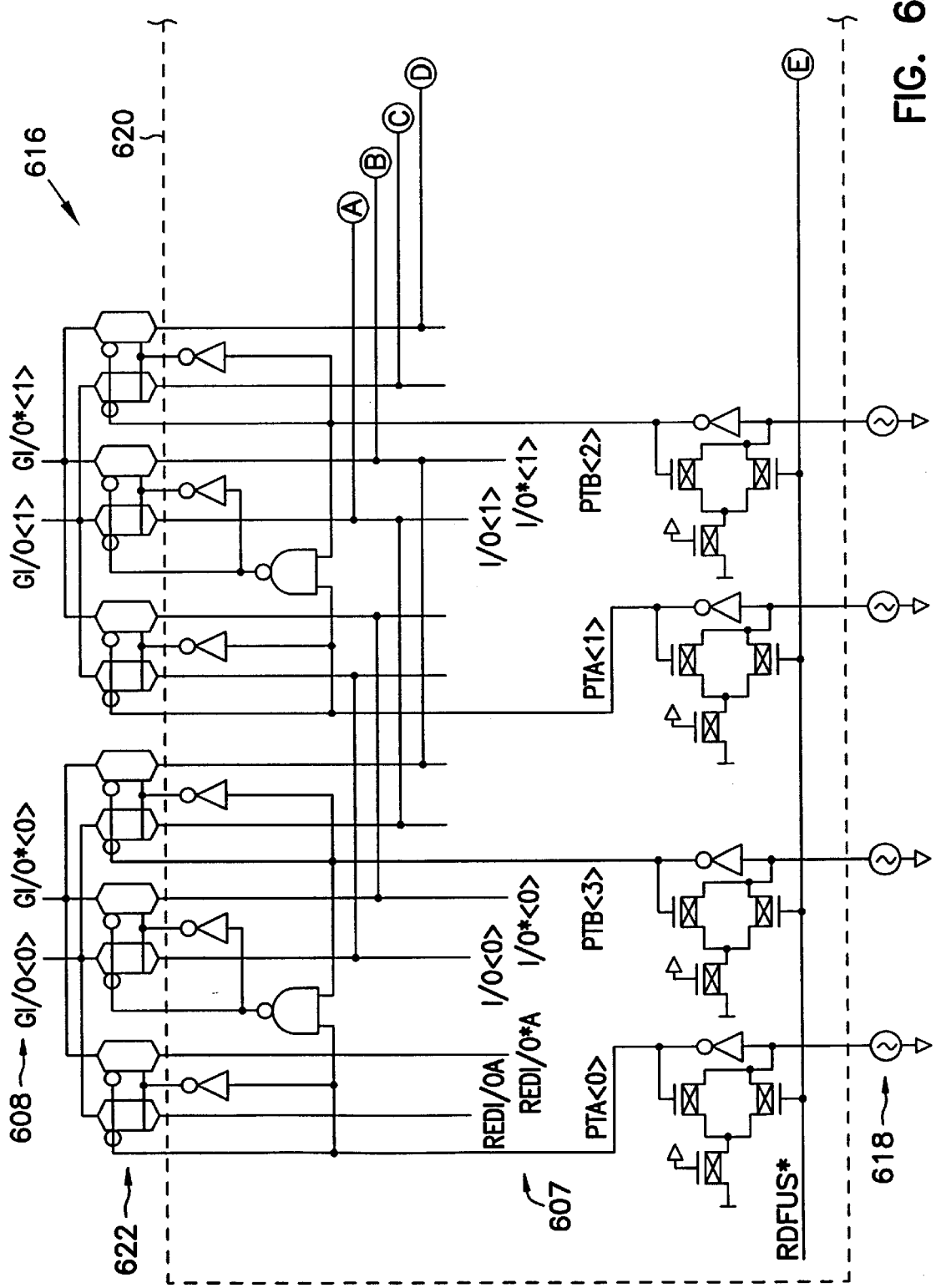
FIGS. 6A and 6B are two parts to a single schematic diagram illustrating in more detail an alternate embodiment of the I/O control circuit of FIG. 3.
Figure 6B:
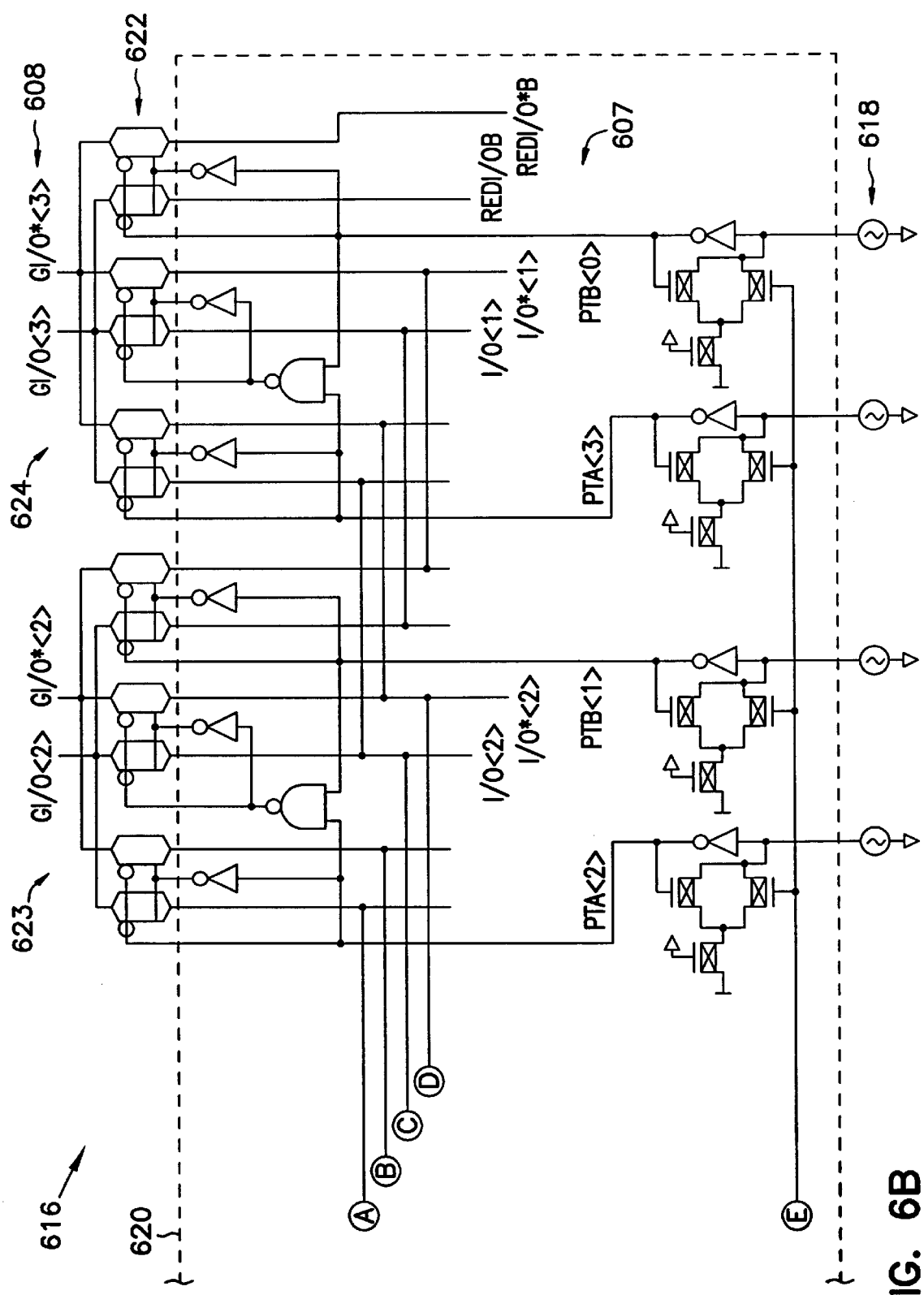

FIG. 5 is a schematic diagram illustrating in more detail an alternate embodiment of an I/O control circuit indicated generally at 516. In FIG. 5, the I/O control circuit 516 includes a fuse bank 518, a logic/select circuit 520, and a number of multiplexors 522. The fuse bank 518 is coupled to the number of multiplexors 522 through the logic/select circuit 520. In this embodiment, fuse programmed considering the location of fuse bank 518 with respect to local I/O lines 507. The number of first input/output or global I/O lines 508 includes complementary pairs of I/O lines identified as GI/O<0>, GI/O*<0>. . . GI/O <3>, and GI/O*<3>, that are coupled to the I/O control circuit 516 and specifically to the number of multiplexors 522. Likewise, the number of second input/output or local I/O lines 507 includes complementary pairs of I/O lines identified as I/O<0>, I/O*<0>, . . . I/O<3>, and I/O*<3> that are coupled to the I/O control circuit 516 and specifically to the number of multiplexors 522.

In this embodiment, each fuse in the fuse bank 518 is independently assigned to one of the number of multiplexors 522 through the logic/select circuit 520. This embodiment provides for one redundant local I/O line per memory block. Each one of the number of multiplexors 522 couples one pair of the number of global I/O lines 508 to two pair of the number of local I/O lines 507.

In operation, I/O control circuit 516 selectively connects local I/O lines 507 with global I/O lines 508. When the memory circuit is fabricated, it is tested to determine whether any of the local I/O lines 507 are defective. Based on this test, fuses or antifuses in fuse bank 518 are selectively blown to indicate which local I/O line 507 should be connected to each of the global I/O lines 508. By way of illustration and not for limitation, the circuits shown in FIGS. 4, 5, and 6A–6B are designed for fuse operation, e.g., laser fuses. Logic/select circuit 520 reads that the state of the fuses or antifuses in fuse bank 518 on power up using the RDFUS* signal and feeds this information to the selector inputs of the multiplexors 522. Thus, for example, if none of the local I/O lines 507 are defective, then each multiplexor 522 simply connects each global I/O line 508 with a similarly labeled local I/O line 507.

However, if one of the local I/O lines 507 is determined to be defective, then the logic/select circuit 520 provides signals to the multiplexors 522 such that the defective local I/O line 507 is not connected to a global I/O line 508 in a similar manner that is described above with respect to FIG. 4.

FIG. 6 is a schematic diagram illustrating in more detail an alternate embodiment of an I/O control circuit indicated generally at 616. In FIG. 6, the I/O control circuit 616 includes a fuse bank 618, a logic/select circuit 620, and a number of multiplexors 622. The fuse bank 618 is coupled to the number of multiplexors 622 through the logic/select circuit 620. The number of first I/O lines 608 includes complementary pairs of I/O lines identified as GI/O<0>, GI/O*<0>. . . GI/O<3>, and GI/O<3>* that are coupled to the I/O control circuit 616 and specifically to the number of multiplexors 622. Likewise, the number of second input/output or local I/O lines 607 include complementary pairs of I/O lines identified as REDI/OA, REDI/O*A, . . . REDI/OB, and RED!/O*B that are coupled to the I/O control circuit 616 and specifically to the number of multiplexors 622.

In this embodiment, each fuse in the fuse bank 618 is independently assigned to one of the number of the number of multiplexors 622 through the logic/select circuit 620. This embodiment provides for two redundant second I/O lines. This embodiment requires an added number of fuses in the fuse bank 618 but provides the added flexibility having multiple operable, local I/O lines to use in the event of a defective local I/O line. Each of the number of multiplexors 622 couples one of the global I/O lines 608 to one of three pair of the local I/O lines 607.

In operation, I/O control circuit 616 selectively connects local I/O lines 607 with global I/O lines 608 in a manner similar to the I/O control circuit 516 of FIG. 5. In this embodiment, however, redundant I/O lines are provided at each end of I/O control circuit 616. Further, each multiplexer 622 is coupled to at least three pair of local input/output lines 607. This allows up to two pair of local I/O lines 607 to be repaired out using this implementation.

Figure 7:
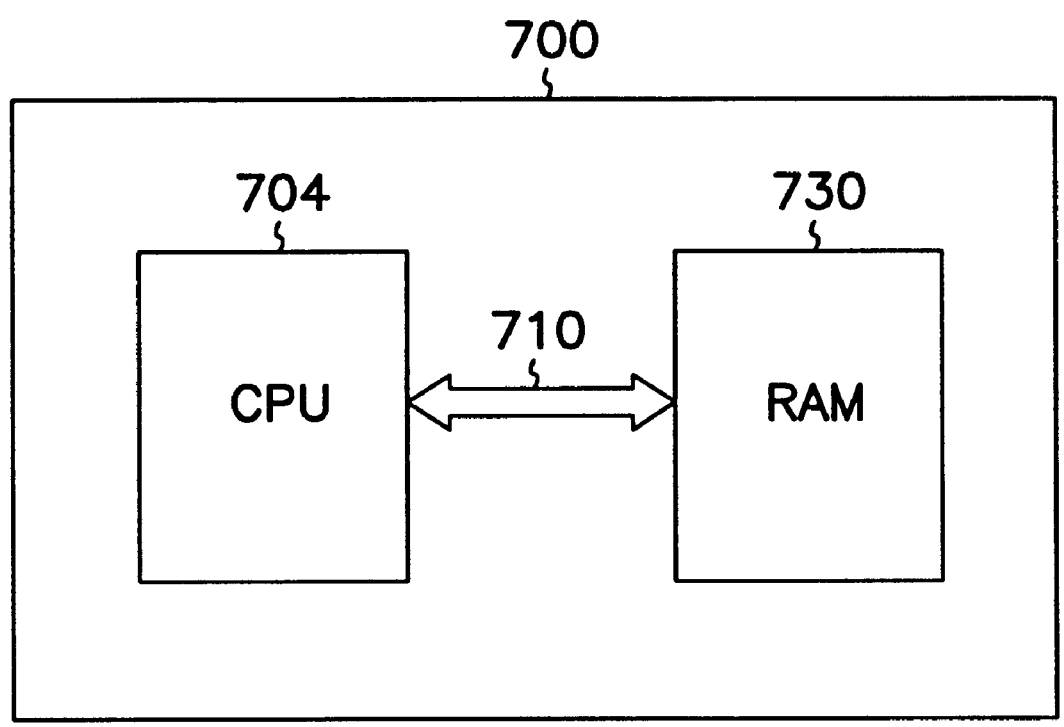
FIG. 7 is a block diagram illustrating an information handling system according to an embodiment of the present invention.

FIG. 7 is a block diagram illustrating an information handling system according to an embodiment of the present invention. The information handling system includes a central processing unit 704. The central processing unit is coupled to a random access memory (RAM) 730 by a system bus 710. The RAM can be constructed as the memory device 100 containing the input/output (I/O) repair circuit shown in the previous Figures. As stated previously, the use of the present invention in connection with a memory circuit, or more specifically as shown here with a RAM, is but one embodiment of the present invention and is not to be construed in a limiting sense. The present invention is additionally suited for application in many other configurations, including other forms of memory, e.g., ROM, or any other structure which involves coupling local I/O lines to global I/O lines to provide a data path.

CONCLUSION

It is to be understood that the above description is intended to be illustrative, and not restrictive. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. For example, the fuse banks used to generate control signals for the multiplexers in each of the described embodiments can be fabricated using either fuses or antifuses. Furthermore, an I/O control circuit constructed according to the teachings of the present invention can be fabricated so as to couple any number of global I/O lines to any appropriate number of I/O lines. The embodiment shown in FIGS. 4, 5, 6A, and 6B are provided by way of illustration and not by way of limitation. The scope of the invention should be determined with reference to the appended claims along with the full scope of equivalents to which such claims are entitled.

What is claimed is:

1. An input/output (I/O) repair circuit, comprising:
   a fuse bank, the fuse bank having multiple fuses that are programmed in either a first or a second state;
   a logic/select circuit coupled to the fuse bank;
   a number of multiplexors coupled to the fuse bank through the logic/select circuit;
   a number of first input/output (I/O) lines coupled to the number of multiplexors; and
   a number of second input/output (I/O) lines each selectively coupled to the number of multiplexors such that the I/O repair circuit is able to replace an inoperable one of the number of second input/output lines without replacing operable ones of the number of second input/output lines.

2. The input/output (I/O) repair circuit of claim 1, wherein each fuse within the fuse bank is indirectly associated with one of the number of multiplexors through a decoder.

3. The input/output (I/O) repair circuit of claim 1, wherein the number of first I/O lines comprise N I/O lines and the number of second I/O lines comprise N+1 I/O lines.

4. An input/output (I/O) repair circuit, comprising:
a fuse bank, the fuse bank having multiple fuses that are programmed in either a first or a second state;
a logic/select circuit coupled to the fuse bank;
a number of multiplexors coupled to the fuse bank through the logic/select circuit;
a number of first input/output (I/O) lines coupled to the number of multiplexors; and
a number of second input/output (I/O) lines each selectively coupled to the number of multiplexors, wherein the number of second input/output lines is greater than the number of first input/output lines and the multiplexers selectively couple first and second input/output lines together such that the I/O repair circuit is able to replace an inoperable one of the number of second input/output lines without replacing operable ones of the number of second input/output lines.

5. An input/output (I/O) repair circuit, comprising:
a fuse bank, the fuse bank having multiple fuses that are programmed in either a first or a second state;
a logic/select circuit coupled to the fuse bank;
a number of multiplexors coupled to the fuse bank through the logic/select circuit;
a number of first input/output (I/O) lines coupled to the number of multiplexors;
a number of second input/output (I/O) lines each selectively coupled to the number of multiplexors, wherein the number of second input/output lines is greater than the number of first input/output lines and the multiplexers selectively couple first and second input/output lines together; and
a memory array coupled to the number of second input/output lines, and wherein the I/O repair circuit is able to replace an inoperable one of the number of second input/output lines independently from replacing columns in the memory array.

6. The input/output (I/O) repair circuit of claim 5, wherein each of the number of first I/O lines is multiplexed to at least two (2) of the number of second I/O lines.

7. An input/output (I/O) repair circuit, comprising:
a fuse bank, the fuse bank having multiple fuses that are programmed in either a first or a second state;
a logic/select circuit coupled to the fuse bank;
a number of multiplexors coupled to the fuse bank through the logic/select circuit;
a number of first input/output (I/O) lines coupled to the number of multiplexors;
a number of second input/output (I/O) lines each selectively coupled to the number of multiplexors, wherein the number of second input/output lines is greater than the number of first input/output lines and the multiplexers selectively couple first and second input/output lines together; and
a memory array coupled to the number of second input/output lines wherein the I/O repair circuit is able to replace an inoperable one of the number of second input/output lines without replacing operable ones of the number of second input/output lines and independently from replacing columns in the memory array.

8. An input/output (I/O) repair circuit, comprising:
a fuse bank, the fuse bank having multiple fuses that are programmed in either a first or a second state;
a logic/select circuit coupled to the fuse bank;
a number of multiplexors coupled to the fuse bank through the logic/select circuit;
a number of first input/output (I/O) lines coupled to the number of multiplexors; and
a number of second input/output (I/O) lines each selectively coupled to the number of multiplexors, wherein the number of second input/output lines is greater than the number of first input/output lines and the multiplexers selectively couple first and second input/output lines together, wherein each of the number of first I/O lines is multiplexed to at least two (2) of the number of second I/O lines, and wherein one of the number of first I/O lines is multiplexed to a first of the at least two (2) second I/O lines when the fuse associated with the multiplexor is in a first state, and wherein one of the number of first I/O lines is multiplexed to a second of the at least two (2) second I/O lines when the fuse associated with multiplexor is in a second state without affecting the coupling of neighboring first and second I/O lines.

9. A memory circuit comprising:
multiple rows of wordlines in a memory block;
multiple columns of bitlines in the memory block, the intersection of the multiple rows of wordlines and multiple columns of bitlines comprising multiple memory cells;
a number of sense amplifiers coupled to the multiple columns of bitlines;
a column decoder coupled to the number of sense amplifiers;
a number of local input/output (I/O) lines coupled to the multiple columns of bitlines through the column decoder;
a number of global input/output (I/O) lines;
a number of multiplexors, wherein the number of multiplexors couple the number of local I/O lines to the number of global I/O lines;
a fuse bank, the fuse bank having a number of fuses, each fuse programmed to a first state or a second state; and
a logic/select circuit coupling the fuse bank to the number of multiplexors such that the state of the fuse determines the coupling between the number of local I/O lines to the number of global I/O lines, wherein the logic/select circuit is able to replace an inoperable one of the number of local I/O lines without replacing operable ones of the number of local I/O lines.

10. The memory circuit of claim 9, wherein each fuse within the fuse bank is independently assigned to one of the number of multiplexors.

11. The memory circuit of claim 9, wherein each fuse within the fuse bank is indirectly associated with one of the number of multiplexors through a decoder.

12. The memory circuit of claim 9, wherein the number of global input/output (I/O) lines comprise N I/O lines and the number of local input/output (I/O) lines comprise N+1 I/O lines.

13. A memory circuit comprising:
multiple rows of wordlines in a memory block;
multiple columns of bitlines in the memory block, the intersection of the multiple rows of wordlines and multiple columns of bitlines comprising multiple memory cells;
a number of sense amplifiers coupled to the multiple columns of bitlines;
a column decoder coupled to the number of sense amplifiers;
a number of local input/output (I/O) lines coupled to the multiple columns of bitlines through the column decoder;

a number of global input/output (I/O) lines;

a number of multiplexors, wherein the number of multiplexors couple the number of local I/O lines to the number of global I/O lines;

a fuse bank, the fuse bank having a number of fuses, each fuse programmed to a first state or a second state; and a logic/select circuit coupling the fuse bank to the number of multiplexors such that the state of the fuse determines the coupling between the number of local I/O lines to the number of global I/O lines, wherein the logic select circuit is able to replace an inoperable one of the number of local I/O lines without replacing operable ones of the number of local I/O lines independently from replacing columns of bitlines.

14. A memory circuit comprising:

multiple rows of wordlines in a memory block;

multiple columns of bitlines in the memory block, the intersection of the multiple rows of wordlines and multiple columns of bitlines comprising multiple memory cells;

a number of sense amplifiers coupled to the multiple columns of bitlines;

a column decoder coupled to the number of sense amplifiers;

a number of local input/output (I/O) lines coupled to the multiple columns of bitlines through the column decoder;

a number of global input/output (I/O) lines;

a number of multiplexors, wherein the number of multiplexors couple the number of local I/O lines to the number of global I/O lines;

a fuse bank, the fuse bank having a number of fuses, each fuse programmed to a first state or a second state; and a logic/select circuit coupling the fuse bank to the number of multiplexors such that the state of the fuse determines the coupling between the number of local I/O lines to the number of global I/O lines, wherein each of the number of global I/O lines is multiplexed to at least two (2) of the number of local I/O lines, wherein the logic select circuit is able to replace an inoperable one of the number of local I/O lines without replacing operable ones of the number of local I/O lines independently from replacing columns of bitlines.

15. The memory circuit of claim 14, wherein one of the number of global I/O lines is multiplexed to a first of the at least two (2) local I/O lines when the fuse associated with the multiplexor is in a first state, and wherein one of the number of global I/O lines is multiplexed to a second of the at least two (2) local I/O lines when the fuse associated with the multiplexor is in a second state.

16. A memory circuit comprising:

multiple rows of wordlines in a memory block;

multiple columns of bitlines in the memory block, the intersection of the multiple rows of wordlines and multiple columns of bitlines comprising multiple memory cells;

a number of sense amplifiers coupled to the multiple columns of bitlines;

a column decoder coupled to the number of sense amplifiers;

a number of local input/output (I/O) lines coupled to the multiple columns of bitlines through the column decoder;

a number of global input/output (I/O) lines;

a number of multiplexors, wherein the number of multiplexors couple the number of local I/O lines to the number of global I/O lines;

a fuse bank, the fuse bank having a number of fuses, each fuse programmed to a first state or a second state; and a logic/select circuit coupling the fuse bank to the number of multiplexors such that the state of the fuse determines the coupling between the number of local I/O lines to the number of global I/O lines, wherein each of the number of global I/O lines is multiplexed to at least three (3) of the number of local I/O lines, wherein the logic select circuit is able to replace an inoperable one of the number of local I/O lines without replacing operable ones of the number of local I/O lines independently from replacing columns of bitlines.

17. A method for replacing inoperable input/output (I/O) lines in a memory circuit, the method comprising:

reading a number of fuses in a fuse bank, each fuse being programmed to a first or a second state, and wherein the fuses are associated with a number of multiplexors;

passing the state information from the number fuses through a logic/select circuit and to the number of multiplexors associated with the number of fuses; and causing at least one of the number of multiplexors to switch the coupling between a global input/output (I/O) line and an inoperable one of a number of local I/O lines when the fuse associated with the multiplexor is programmed to the second state, wherein the inoperable one of the number of local I/O lines is replaced without replacing operable ones of the number of local I/O lines.

18. A method for replacing inoperable input/output (I/O) lines in a memory circuit, the method comprising:

reading a number of fuses in a fuse bank, each fuse being programmed to a first or a second state, and wherein the fuses are associated with a number of multiplexors;

passing the state information from the number fuses through a logic/select circuit and to the number of multiplexors associated with the number of fuses; and causing at least one of the number of multiplexors to switch the coupling between a global input/output (I/O) line and a number of local I/O lines when the fuse associated with the multiplexor is programmed to the second state, wherein causing at least one of the number of multiplexors to switch the coupling between the global I/O line and the number of local I/O lines comprises coupling the global I/O line to a redundant local I/O line without replacing any operable ones of the number of local I/O lines.

19. A method for replacing inoperable input/output (I/O) lines in a memory circuit, the method comprising:

reading a number of fuses in a fuse bank, each fuse being programmed to a first or a second state, and wherein the fuses are associated with a number of multiplexors;

passing the state information from the number fuses through a logic/select circuit and to the number of multiplexors associated with the number of fuses; and causing at least one of the number of multiplexors to switch the coupling between a global input/output (I/O) line and a number of local I/O lines when the fuse associated with the multiplexor is programmed to the second state, wherein passing the state information from the number of fuses through the logic/select circuit and to the number of multiplexors associated with the number of fuses includes replacing an inoperable one of the number of local I/O lines without replacing operable ones of the number of local I/O lines.

20. A method for replacing inoperable input/output (I/O) lines in a memory circuit, the method comprising:
   reading a number of fuses in a fuse bank, each fuse being programmed to a first or a second state, and wherein the fuses are associated with a number of multiplexors;
   passing the state information from the number fuses through a logic/select circuit and to the number of multiplexors associated with the number of fuses; and
   causing at least one of the number of multiplexors to switch the coupling between a global input/output (I/O) line and a number of local I/O lines when the fuse associated with the multiplexor is programmed to the second state, wherein causing at least one of the number of multiplexors to switch the coupling between the global input/output (I/O) line and a number of local I/O lines includes coupling the global I/O line to a redundant local I/O line without replacing operable ones of the number of local I/O lines.

21. A method for replacing inoperable input/output (I/O) lines in a memory circuit, the method comprising:
   reading the state of a number of programmed fuses, the number of programmed fuses being associated with a number of multiplexors, each of the number of multiplexors coupling a global I/O lines to a number of local I/O lines coupled a number of column lines in a memory array; and
   when at least one of the fuses is programmed to indicate that one of the number of local I/O lines coupled to one of the number of multiplexors is inoperable, replacing the inoperable local I/O line with an adjacent local I/O line without replacing operable ones of the number of local I/O lines and independently from replacing column lines in the memory array.

22. The method of claim 21, the method further comprising coupling the adjacent local I/O line with the global I/O line through one of a number of multiplexors.

23. The method of claim 21, wherein replacing the inoperable local I/O line with an adjacent local I/O line further comprises passing the state of the number of programmed fuses to the number of associated multiplexors through a logic/select circuit.

24. An information handling system comprising:
   a central processing unit;
   a random access memory, the random access memory further comprising:
      multiple rows of wordlines in a memory block;
      multiple columns of bitlines in the memory block, the intersection of the multiple rows of wordlines and multiple columns of bitlines comprising multiple memory cells;
      a number of sense amplifiers coupled to the multiple columns of bitlines;
      a column decoder coupled to the number of sense amplifiers;
      a number of local input/output (I/O) lines coupled to the multiple columns of bitlines through the column decoder;
      a number of global input/output (I/O) lines;
      a number of multiplexors, wherein the number of multiplexors couple the number of local I/O lines to the number of global I/O lines;
      a fuse bank, the fuse bank having a number of fuses, each fuse programmed to a first state or a second state; and
      a logic/select circuit coupling the fuse bank to the number of multiplexors such that the state of the fuse determines the coupling between an adjacent pair of the number of local I/O lines to the number of global I/O lines such that the logic select circuit is able to replace an inoperable one of the number of local I/O lines without replacing operable ones of the number of local I/O lines; and
   a system bus for communicatively coupling the central processing unit and the random access memory.

25. The information handling system of claim 24, wherein each fuse within the fuse bank is independently assigned to one of the number of multiplexors.

26. The information handling system of claim 24, wherein each fuse within the fuse bank is indirectly associated with one of the number of multiplexors through a decoder.

27. The information handling system of claim 24, wherein the number of global input/output (I/O) lines comprise N I/O lines and the number of local input/output (I/O) lines comprise N+1 I/O lines.

28. An information handling system comprising:
   a central processing unit;
   a random access memory, the random access memory further comprising:
      multiple rows of wordlines in a memory block;
      multiple columns of bitlines in the memory block, the intersection of the multiple rows of wordlines and multiple columns of bitlines comprising multiple memory cells;
      a number of sense amplifiers coupled to the multiple columns of bitlines;
      a column decoder coupled to the number of sense amplifiers;
      a number of local input/output (I/O) lines coupled to the multiple columns of bitlines through the column decoder;
      a number of global input/output (I/O) lines;
      a number of multiplexors, wherein the number of multiplexors couple the number of local I/O lines to the number of global I/O lines;
      a fuse bank, the fuse bank having a number of fuses, each fuse programmed to a first state or a second state; and
      a logic/select circuit coupling the fuse bank to the number of multiplexors such that the state of the fuse determines the coupling between the number of local I/O lines to the number of global I/O lines, wherein the logic select circuit is able to replace an inoperable one of the number of local I/O lines without replacing operable ones of the number of local I/O lines and independently from replacing columns of bitlines; and
   a system bus for communicatively coupling the central processing unit and the random access memory.

* * * * *

UNITED STATES PATENT AND TRADEMARK OFFICE
CERTIFICATE OF CORRECTION

PATENT NO. : 6,333,887 B1
DATED : December 25, 2001
INVENTOR(S) : Huy Thanh Vo

Page 1 of 1

It is certified that error appears in the above-identified patent and that said Letters Patent is hereby corrected as shown below:

Column 1,
Line 27, insert -- , -- after "defective".

Column 2,
Lines 30-31, paragraph beginning with "A number of sense amplifiers…" should be part of the previous paragraph beginning with "In another embodiment, a memory circuit…"

Column 4,
Lines 39-40, paragraph beginning with "The control circuit 118…" should be part of the previous paragraph beginning with "FIG. 1 further includes…"
Lines 62-63, paragraph beginning with "A number of first input/output…" should be part of the previous paragraph beginning with "FIG. 2 is a block diagram…"

Column 7,
Line 2, insert -- bank 518 may comprise a number of anti-fuses which can more easily be -- after "fuse".
Line 56, delete "RED!/O*B" and insert -- REDI/O*B --, therefor.

Column 13,
Line 29, insert -- to -- after "coupled".

Signed and Sealed this

Seventh Day of May, 2002

*Attest:*

*Attesting Officer*

JAMES E. ROGAN
*Director of the United States Patent and Trademark Office*